United States Patent
Gundling et al.

(10) Patent No.: US 11,379,632 B2
(45) Date of Patent: Jul. 5, 2022

(54) SIMULATED-DRIVING-ENVIRONMENT GENERATION

(71) Applicant: Applied Intuition, Inc., Sunnyvale, CA (US)

(72) Inventors: Christopher Gundling, Redwood City, CA (US); Varun Mittal, San Jose, CA (US)

(73) Assignee: Applied Intuition, Inc., Sunnyvale, CA (US)

( * ) Notice: Subject to any disclaimer, the term of this patent is extended or adjusted under 35 U.S.C. 154(b) by 0 days.

(21) Appl. No.: 16/424,468

(22) Filed: May 28, 2019

(65) Prior Publication Data

US 2020/0380083 A1 Dec. 3, 2020

(51) Int. Cl.
*G06F 30/20* (2020.01)
*G06T 17/05* (2011.01)
*G06T 17/20* (2006.01)
*G05D 1/00* (2006.01)

(52) U.S. Cl.
CPC ......... *G06F 30/20* (2020.01); *G05D 1/0088* (2013.01); *G06T 17/05* (2013.01); *G06T 17/20* (2013.01); *G05D 2201/0213* (2013.01)

(58) Field of Classification Search
CPC ....... G06F 30/20; G05D 1/0088; G06T 17/05; G06T 17/20
USPC .......................................................... 345/420
See application file for complete search history.

(56) References Cited

U.S. PATENT DOCUMENTS

| | | | | |
|---|---|---|---|---|
| 2008/0221843 | A1* | 9/2008 | Shenkar | G06T 17/05 703/1 |
| 2012/0059720 | A1* | 3/2012 | Musabji | G06T 17/05 705/14.58 |
| 2016/0314224 | A1* | 10/2016 | Wei | G06F 30/20 |
| 2019/0056739 | A1* | 2/2019 | Sunil Kumar | G06K 9/00791 |
| 2019/0278293 | A1* | 9/2019 | Levinson | G05D 1/0251 |
| 2020/0051327 | A1* | 2/2020 | Dolan | G06T 15/04 |

* cited by examiner

*Primary Examiner* — Hai Tao Sun
(74) *Attorney, Agent, or Firm* — Buchalter; Jason W. Croft

(57) ABSTRACT

A method may include obtaining HD mapping data including multiple data topics with one or more distinct instances. The method may include creating multiple meshes from corresponding distinct instances. The method may include defining multiple textures for each data topic. The method may include selecting a first data topic and a first distinct instance of the first data topic. The method may include selecting a first texture for the first data topic and applying the first texture to a first mesh corresponding with the first distinct instance. The method may include selecting a second distinct instance of the first data topic. The method may include selecting a second texture and applying the second texture to a second mesh corresponding with the second distinct instance. The method may also include combining the first mesh and the first texture with the second mesh and the second texture to generate a combined mesh.

20 Claims, 7 Drawing Sheets

SIMULATED-DRIVING-ENVIRONMENT GENERATION

FIELD

The embodiments discussed in the present disclosure are related to simulated-driving-environment generation.

BACKGROUND

A simulated environment may be used to test software. For example, a simulated driving environment may be used to test software of an autonomous vehicle.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

A method may include obtaining HD mapping data including multiple data topics with one or more distinct instances. The method may include creating multiple meshes from corresponding distinct instances. The method may include defining multiple textures for each data topic. The method may include selecting a first data topic and a first distinct instance of the first data topic. The method may include selecting a first texture for the first data topic and applying the first texture to a first mesh corresponding with the first distinct instance. The method may include selecting a second distinct instance of the first data topic. The method may include selecting a second texture and applying the second texture to a second mesh corresponding with the second distinct instance. The method may also include combining the first mesh and the first texture with the second mesh and the second texture to generate a combined mesh.

The objects and advantages of the embodiments will be realized and achieved at least by the elements, features, and combinations particularly pointed out in the claims.

Both the foregoing general description and the following detailed description are given as examples and are explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
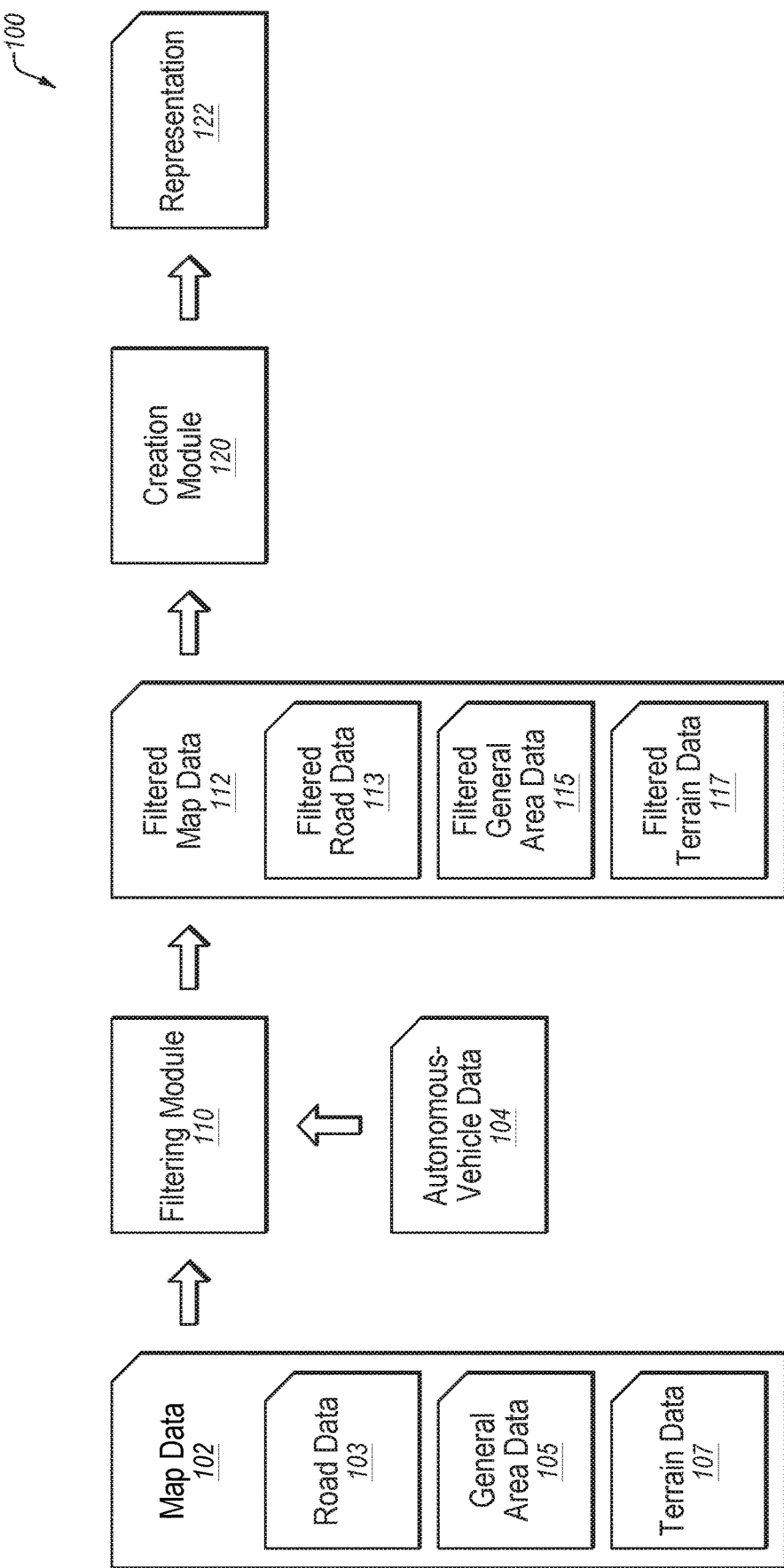
FIG. 1 is a diagram representing an example environment related to generating a simulated driving environment.

An autonomous-vehicle software testbed may be used to test autonomous-vehicle software. The autonomous-vehicle software testbed may simulate a driving environment to test the autonomous-vehicle software (e.g., to determine how the autonomous-vehicle software would perform in various driving situations). For example, the autonomous-vehicle software testbed may simulate a three dimensional (3-D) geographical environment and provide inputs to the autonomous-vehicle software that are analogous to inputs that the autonomous-vehicle software may receive in real-world driving conditions if the autonomous-vehicle software were running on an autonomous vehicle navigating within the actual geographical environment.

For instance, the autonomous-vehicle software testbed may simulate a 3-D city, including roads and various objects included in the 3-D city. Additionally, the corresponding autonomous vehicle may include a camera and the autonomous-vehicle software may use images captured by the camera to navigate the 3-D city, In these or other embodiments, the autonomous-vehicle software testbed may provide images and/or video analogous to what the camera on the autonomous vehicle might capture if the autonomous vehicle were driving in the simulated 3-D city to test how the autonomous-vehicle software may respond to such images.

Some embodiments described in the present disclosure relate to methods and systems of generating a simulated 3-D geographical environment that may be used with an autonomous-vehicle software testbed. In some embodiments, the 3-D geographical environment may be generated based on real-world map data.

For example, in some embodiments, operations of the present disclosure may include obtaining map data of a geographic area that may include information about roads and areas between roads.

In some cases, some of the information may be more detailed than the information that is likely to be used by the autonomous-vehicle software. For example, the map data may include a detailed map of the top of a building.

In some embodiments, the operations may include filtering the obtained map data and using the filtered map data to generate the simulated 3-D geographical environment. In these or other embodiments, the filtering may be based on sensor information that may be used by the autonomous-vehicle software. For example, if an autonomous vehicle includes cameras and Light Detection and Ranging (LIDAR) sensors that are pointed horizontally and below horizontal, the operations of the present disclosure may include filtering out map data that includes details of objects above a certain height above the road because such details may not be detected by the LIDAR sensors and cameras and consequently may not be used by the autonomous-vehicle software. Areas above a certain height may be outside of the sensor field of view, thus little or no data may be obtained above the height.

In some embodiments, the operations of the present disclosure may include generating a 3-D environmental representation of the geographic area based on the filtered map data. The 3-D environmental representation may be used as part of a 3-D geographical environment e.g., in an autonomous-vehicle software testbed. In some embodiments, the 3-D environmental representation may include a 3-D mesh generated from HD map data, such as, for example, a 3-D mesh generated from a point cloud. In these and other embodiments, the point cloud may include a collection of points to represent objects in space. For example, a point cloud may include data generated from a LIDAR sensor. In these and other embodiments, the 3-D mesh may include multiple polygons created using the points in the point cloud as reference points to define the polygons.

The filtered map data may include less data than the unfiltered map data. As such, it may take less processing time to generate the 3-D environmental representation based on the filtered map data than to generate a 3-D environmental representation based on the unfiltered map data. Additionally, because the filtering of the map data may be based on how the autonomous-vehicle software may use inputs based on the map data, a 3-D environmental representation based on filtered map data may be just as useful for testing autonomous-vehicle software as a 3-D environmental representation based on unfiltered data. Thus, the operations of the present disclosure may constitute an improvement in the generation of a 3-D environmental representation because the 3-D environmental representation based on the filtered map data may have been generated faster and/or more efficiently. Therefore, filtering map data for generation of a 3-D environmental representation may constitute an improvement in computer-related technology (e.g., 3-D environmental representation generation and/or autonomous-vehicle software testing).

Additionally, filtering map data may have a practical application at least in the field of 3-D modeling and/or autonomous-vehicle software testing. For example, filtering map data may be applied to the field of 3-D modeling to reduce unnecessary information in 3-D models which may result in 3-D model generation that is faster and/or more efficient while maintaining utility of the resulting 3-D models. Additionally or alternatively, 3-D models without unnecessary information may require less storage space and may be able to be rendered faster and/or more efficiently.

In addition, in some embodiments, the map data may include high definition (HD) mapping data. The HD mapping data may include data in a point cloud and may be separated into different data topics. In some cases, 3-D environment representation generation may include generating one or more meshes based on the point cloud.

In these or other embodiments, the point cloud data that corresponds to different data topics may be organized as individual meshes that may each represent a corresponding data topic. For example, in some embodiments, the 3-D environment representation generation operations may include separately processing each data topic of the HD mapping data to generate meshes for each data topic. In some embodiments, multiple textures may be created for each data topic. In these and other embodiments, the multiple textures may enable the resulting simulation environment to more realistically reflect actual environments in which an autonomous vehicle may operate. In some embodiments, the HD mapping data may be filtered prior to being processed to generate the meshes.

In some embodiments, the HD mapping data may include LIDAR data from LIDAR sensors. In these and other embodiments, the LIDAR sensors may obtain many points arranged in a point cloud. In these and other embodiments, the point cloud may include a collection of points to represent an object in space. For example, each point in a point cloud may include both a positional component and an intensity component. For example, each point in the point cloud may be associated with x-, y-, and z-coordinates and with an intensity. In these and other embodiments, the intensity of a point may be associated with a particular data topic, or type of object in the environment. For example, lane lines may be associated with a different intensity than curb edges or trees. In some embodiments, the operations of the present disclosure may include generating one or more meshes with one or more textures based on the HD mapping data or based on filtered HD mapping data from LIDAR sensors.

In some embodiments, the operations of the present disclosure may include generating the 3-D environmental representation of the geographic area by combining a variety of meshes together with textures for each mesh to create an overall mesh.

Separately generating meshes for each data topic and generating multiple textures for each data topic may result in more robust 3-D simulation environments for autonomous vehicles. For example, separately generating meshes for each data topic may include less data than generating meshes for an entire point cloud at once. For example, each data topic may be generated using different filtering of the associated data points from the point cloud, which may allow the data topics to retain accuracy without including extraneous information. As such, it may take less processing time to generate the combined mesh for the point cloud when separately processing each data topic than when processing the point cloud as a whole at once. Additionally, because multiple different textures may be applied to instances of a single data topic, a single simulation environment may present an autonomous vehicle with different depictions of a singular element, such as lane lines, which may improve the ability of the simulation environment to test the autonomous vehicle. In addition, applying textures to the meshes may improve the speed of generating a simulation environment and/or enable the simulation environment to be modified for different scenarios. Thus, the operations of the present disclosure may constitute an improvement in the generation of a 3-D environmental representation because the 3-D meshes may have been generated faster and/or more efficiently. Therefore, the meshes and/or textures used for generation of a 3-D environmental representation may constitute an improvement in computer-related technology (e.g., 3-D environmental representation generation and/or autonomous-vehicle software testing).

Additionally, separately processing each data topic may have a practical application at least in the field of 3-D modeling and/or autonomous-vehicle software testing. For example, separately processing each data topic may be applied to the field of 3-D modeling to optimize the filtering of data points in a data cloud to reduce unnecessary information in 3-D models which may result in 3-D model generation that is faster and/or more efficient while maintaining utility of the resulting 3-D models. Additionally or alternatively, 3-D models without unnecessary information may require less storage space and may be able to be rendered faster and/or more efficiently.

Embodiments of the present disclosure are explained with reference to the accompanying drawings.

FIG. 1 is a diagram representing an example environment 100 related to generating a simulated driving environment, arranged in accordance with at least one embodiment described in the present disclosure. The environment 100 may include a filtering module 110 configured to filter map data 102 based on how autonomous-vehicle software may use inputs that may be obtained based on the map data 102. In some embodiments, the filtering module 110 may filter the map data 102 based on autonomous-vehicle data 104. The filtering module 110 may output filtered map data 112. In these or other embodiments, the environment 100 may include an environmental representation-creation module 120 (creation module 120) configured to generate a 3-D environmental representation 122 (representation 122) based on the filtered map data 112.

In some embodiments, the map data 102 may include data describing a geographic area. The map data 102 may describe a geographic area in the real world. The map data 102 may include multiple layers of data describing the same geographic area. For example, the map data 102 may include road data 103 describing roads, general area data 105 describing the appearance and size of buildings and other areas between the roads, and terrain data 107 describing changes in elevation. The road data 103, the general area data 105, and the terrain data 107 may all describe the same geographic area and may together provide a more complete description of the geographic area than any one of them may provide alone.

The map data 102 may include information found on a street map or information observable from an aerial photo or a satellite photo. Additionally or alternatively, the map data 102 may include information obtained by a vehicle traveling on the roads of the geographic area and capturing images of the geographic area. The map data 102 may include detailed, for example, high definition (HD) information. For instance, the map data 102 may include LIDAR data in a format such as, for example, a point cloud. In some embodiments, each data point in the point cloud may include positional information (e.g., x-, y-, and z-coordinates on three-dimensional axes) as well as intensity information (e.g., reflective information). The points in the point cloud may correspond to elements in the geographic setting associated with the HD map data. In some embodiments, the intensity information may facilitate the differentiation of the points in the point cloud into different data topics that may correspond to different types of elements. For example, based on the intensity information, points in the point cloud may be characterized into data topics such as "lane lines," "trees," "curbs," "road edges," "sidewalks" "roads," "trees," or other categories. In some embodiments, points in the point cloud may be organized into data topics based on the intensity information, the positional information, and/or other information. In some embodiments, a LIDAR point cloud may include or may be supplemented by Global Positioning System (GPS) data. For example, a center of the point cloud may be associated with particular GPS coordinates and the positional information (i.e., the x-, y-, and z-coordinates) may be referenced from the center.

In some embodiments, the map data 102 may be or may include photographs of an intersection including resolution on a centimeter scale or an even more granular scale. In these and other embodiments, photographs may be used to enhance the LIDAR point cloud. The map data 102 may include other highly accurate HD data, for example, the location of the intersection in the map data 102 may be an accurate representation of where the intersection is in the real world to within a centimeter. Additionally or alternatively, the map data 102 may include less-accurate information about other aspects of the geographic area. For instance the map data 102 may not distinguish between individual trees in a copse of trees.

The map data 102 may include the road data 103 of roads in the geographic area. The road data 103 may include locations of elements including: roads, sidewalks, lane lines, curbs, sidewalk edges, intersections, road signs, traffic lights, cross walks, parking lots, parking structures, bridges, overpasses, tunnels, railroad crossings, islands between lanes, bike lanes, traffic signs, and school zones.

Additionally or alternatively, the map data 102 may include the general area data 105 that may include information regarding areas between the roads of the geographic area. The general area data 105 may include information about buildings, parks, fields, and outdoor areas. The general area data 105 may include images of buildings or images taken from the road of areas between the roads. The general area data 105 may include 3-D representations of objects, for example, buildings, fire hydrants, and light posts.

Additionally or alternatively, the map data 102 may include the terrain data 107 of the geographic area. The terrain data 107 may include elevation data of the geographic area, for example, a topographical map of the geographic area.

In some embodiments, the autonomous-vehicle data 104 may include information about inputs of autonomous-vehicle software and how the inputs may be used by the autonomous-vehicle software. For example, the autonomous-vehicle data 104 may include information about sensors on an autonomous vehicle. For instance, information about what kinds of sensors are used, resolution of the sensors, depth of focus of the sensors, pointing direction of the sensors, frame-rate of the sensors, and/or scan-rate of the sensors and/or emitters. Additionally or alternatively, the autonomous-vehicle data 104 may include information about how data from the sensors is used in the autonomous-vehicle software. For example, the autonomous-vehicle software may be configured to use high-resolution image processing techniques on high-resolution images of the road in front of the autonomous vehicle at a high frequency of recurrence. As another example, the autonomous-vehicle software may be configured to use low-resolution image processing techniques on portions of images that include space that is more than five meters from the road on which the autonomous vehicle is travelling.

The filtering module 110 may include code and routines configured to enable a computing device to perform one or more operations with respect to filtering map data 102 to obtain the filtered map data 112. Additionally or alternatively, the filtering module 110 may be implemented using hardware including a processor, a microprocessor (e.g., to perform or control performance of one or more operations), a field-programmable gate array (FPGA), or an application-specific integrated circuit (ASIC). In some other instances, the filtering module 110 may be implemented using a combination of hardware and software. In the present disclosure, operations described as being performed by the filtering module 110 may include operations that the filtering module 110 may direct a corresponding system to perform.

The filtered map data 112 may include map data selected from the map data 102. As such, the filtered map data 112 may include the map data 102 and/or a selected (e.g., filtered) a subset of the map data 102. The filtered map data 112 may include filtered road data 113, which may include the road data 103 and/or a selected (e.g., filtered) subset of the road data 103. Additionally or alternatively, the filtered map data 112 may include filtered general area data 115, which may include the general area data 105 or a selected (e.g., filtered) subset of the general area data 105. Additionally or alternatively, the filtered map data 112 may include filtered terrain data 117, which may include the analysis module 107 or a selected (e.g., filtered) subset of the analysis module 107.

In some embodiments, some of the information of the filtered map data 112 may have been filtered more by the filtering module 110 than other information such that different types of information in the filtered map data 112 may have different levels of accuracy and/or resolution. For example, the filtered road data 113 may retain a high amount of its initial accuracy and/or resolution while filtered general area data 115 may retain a lower amount of its initial accuracy and/or resolution.

The filtering module 110 may be configured to select map data 102 for inclusion in the filtered map data 112 based on a relationship between the map data 102 and the autonomous-vehicle data 104. More specifically, the filtering module 110 may be configured to select (which may include filtering) road data 103 of the map data 102, according to a first degree of accuracy based on a relationship between the road data 103 and how the autonomous-vehicle software may use information derived from the road data 103. (Information derived from the road data 103 may include simulated images or other sensor readings based on a 3-D environmental representation of roads or other elements of the road data 103.)

As an example of selection of the road data 103 by the filtering module 110, a relationship may describe that the autonomous-vehicle software is configured to process images with image processing techniques providing a first level of accuracy. The road data 103 may include images that include a higher level of accuracy than the first level of accuracy. In these cases, the road data 103 may be filtered such that the information retained corresponds to the first level or accuracy.

In some embodiments, the filtering may depend on the environment from which the HD map data is obtained. For example, in some embodiments, the HD map data may be from a highway. In these and other embodiments, objects in the environment may be of relatively little importance and/or may be relatively static. For example, in some locations, a highway may be relatively straight with few turns. In these and other embodiments, more of the data may be filtered without losing any accuracy. For example, if the HD map data includes a point cloud with 100,000 points, 50,000 of the points may be filtered when the HD map data corresponds with a highway.

Alternatively, in some embodiments, the HD map data may be from an urban environment. In these and other embodiments, objects in the environment may be of relatively great importance and/or may not be relatively static. For example, in some locations, urban streets may include many turns, objects, or other details. In these and other embodiments, few points may be filtered. For example, if the HD map data includes a point cloud with 100,000 points, 10,000 of the points may be filtered when the HD map data corresponds with an urban area.

In some embodiments, different data topics may include different amounts of filtering. For example, in some embodiments, points in a "road edge" data topic may be filtered to a greater degree than points in a "lane line" data topic. Alternatively or additionally, in some embodiments, points in a "dashed line" data topic may be filtered to a greater degree than points in a "solid line" data topic. In some embodiments, different data topics may be filtered in different degrees depending on the environment. For example, in a highway environment, points in a "road edge" data topic may be filtered less than other points. Alternatively, in an urban environment, points in a "curbs" data topic may be filtered less than other points.

As an example of selection of the road data 103 by the filtering module 110, a relationship may describe that the autonomous-vehicle software may determine and/or control the position of tires of the autonomous vehicle relative to line lanes and/or curbs to within one centimeter. In these cases, the filtering module 110 may be configured to select road data 103 including all road data having one centimeter accuracy, or one-half centimeter accuracy. In some embodiments, this may mean the selection of all available road data 103 for inclusion in the filtered road data 113 without filtering or removing any of the accuracy and/or resolution of the road data.

In some embodiments, the autonomous-vehicle software may be configured to determine and/or control the position of the vehicle (e.g., the tires of the vehicle) with a high degree of accuracy relative to elements of the road data. For example, the autonomous-vehicle software may spend more processing time determining where the vehicle is relative to the lane lines than the processing time spent determining where the vehicle is relative to a building beside the road. As such, the autonomous-vehicle software may determine where the autonomous vehicle is relative to the lane lines with a higher degree of accuracy than the degree of accuracy used in determining the where the autonomous vehicle is relative to the building.

In these or other embodiments, the filtering module 110 may be configured to select general area data 105 of the map data 102, according to a second degree of accuracy (which may be lower than the first degree of accuracy) based on a relationship between the general area data 105 and how the autonomous-vehicle software may use information derived from the general area data 105. (Information derived from the general area data may include simulated images or other sensor readings based on a 3-D environmental representation of objects of the general area data 105.)

As an example of selection of general area data 105 by the filtering module 110, one of the relationships may describe that the autonomous-vehicle software ignores inputs and/or the autonomous-vehicle sensors are not angled to receive inputs that are more than six meters above the ground. Based on this relationship, the filtering module 110 may exclude (or include at a limited resolution and/or accuracy) general area data 105 regarding anything higher than six meters from the ground in the filtered general area data 115. As an example of selection of the general area data 105 by the filtering module 110, a relationship may describe that the autonomous-vehicle software is configured to process all images at all angles with image processing techniques providing a certain level of accuracy. The general area data 105 may include images that include a lower level of accuracy than the certain level of accuracy. In these cases, the general area data 105 may be selected without any filtration for inclusion in the filtered general area data 115.

In these or other embodiments, the filtering module 110 may be configured to select general area data 105 of the map data 102, according to a second degree of accuracy (which may be lower than the first degree of accuracy) based on a relationship between the general area data 105 and the road data 103. For example, one of the relationships may describe that the autonomous-vehicle sensors can only focus on objects within 2 meters of the sensors. Based on an assumption that the autonomous vehicle will travel on roads, it may be determined that objects more than three meters from any road do not require high resolution and/or accuracy. Based on this determination, the filtering module 110 may reduce the resolution and/or accuracy in filtered general area data 115 of objects that are more than three meters from any road.

In these or other embodiments, the filtering module 110 may be configured to select terrain data 107 of the map data 102, according to a third degree of accuracy (which may be the same as or lower than the first degree of accuracy) based on a relationship between the terrain data 107 and how the autonomous-vehicle software may use information derived from the terrain data 107. Information derived from the terrain data 107 may include simulated images or other sensor readings (e.g., readings from an accelerometer, a gyroscope, and/or shocks of the autonomous vehicle) based on a 3-D environmental representation of terrain of the terrain data 107. For example, a simulated 3-D representation of a road based on terrain data 107 may include inclines and declines based on inclines and declines in the terrain data 107. Information presented to the autonomous-vehicle software may reflect the inclines and declines. For example, images of the road and/or genera area may be adjusted to reflect the inclines and declines. For example, an image of a road may be stretched or shrunken such that it fits a 3-D representation of the road. Additionally or alternatively, gyroscopic and/or accelerometer data may reflect the inclines and declines. For example, the simulated gyroscopic data may indicate that the car is oriented pointing upward when the simulated autonomous vehicle is on a simulated incline.

As an example of selection of terrain data 107 by the filtering module 110, in some areas, the elevation data of the analysis module 107 may have a higher degree of accuracy than the road data 103. In such cases, the filtering module 110 may reduce the accuracy of elevation data 107 to be no more than the accuracy of the map data 103.

In some embodiments, the filtering module 110 may take the autonomous-vehicle data 104 as an input. In these or other embodiments, the filtering module 110 may be configured to determine relationships between the map data 102 and how information derived from the map data 102 may be used by the autonomous-vehicle software based on the autonomous-vehicle data 104. Additionally or alternatively, the filtering module 110 may obtain the relationships between the map data 102 and how information derived from the map data 102 may be used by the autonomous-vehicle software from another source. For example, a user may define the relationships and provide the relationships to the filtering module 110. In these or other embodiments, the filtering module 110 may not require the autonomous-vehicle data 104 as an input. Additionally or alternatively, the filtering module 110 may obtain filters that are based on the relationships between the map data 102 and how information derived from the map data 102 may be used by the autonomous-vehicle software from another source. For example, a user, or another system may generate filters based on the relationships. The filtering module 110 may use the filters generated by the user or the other system.

The environmental representation-creation module 120 may include code and routines configured to enable a computing device to perform one or more operations with respect to generating the 3-D environmental representation 122 based on the filtered map data 112. Additionally or alternatively, the environmental representation-creation module 120 may be implemented using hardware including a processor, a microprocessor (e.g., to perform or control performance of one or more operations), a field-programmable gate array (FPGA), or an application-specific integrated circuit (ASIC). In some other instances, the environmental representation-creation module 120 may be implemented using a combination of hardware and software. In the present disclosure, operations described as being performed by the environmental representation-creation module 120 may include operations that the environmental representation-creation module 120 may direct a corresponding system to perform.

In some embodiments, the environmental representation-creation module 120 may be configured to generate the 3-D environmental representation 122. The environmental representation-creation module 120 may generate the 3-D environmental representation 122 according to any suitable 3-D modeling technique. In some embodiments, the environmental representation-creation module 120 may use the filtered map data 112 as input data in the generation of the 3-D environmental representation 122. For example, the environmental representation-creation module 120 may base the 3-D environmental representation 122 on the filtered map data 112. For example, the 3-D environment of the 3-D environmental representation 122 may represent the geographic area represented by the filtered map data 112.

In some embodiments, the 3-D environmental representation 122 may include a 3-D model of one or more objects in the geographic area as described by the filtered map data 112. For example, the 3-D environmental representation 122 may include a complete 3-D model of the simulated driving environment.

Modifications, additions, or omissions may be made to the environment 100 of FIG. 1 without departing from the scope of the present disclosure. For example, the environment 100 may include more or fewer elements than those illustrated and described in the present disclosure. For instance, in some embodiments, the autonomous-vehicle data 104 may be omitted. In these embodiments, relationships derived from the autonomous-vehicle data 104 may be included in the filtering module 110, or may be provided to the filtering module 110 in some other format.

Figure 2:
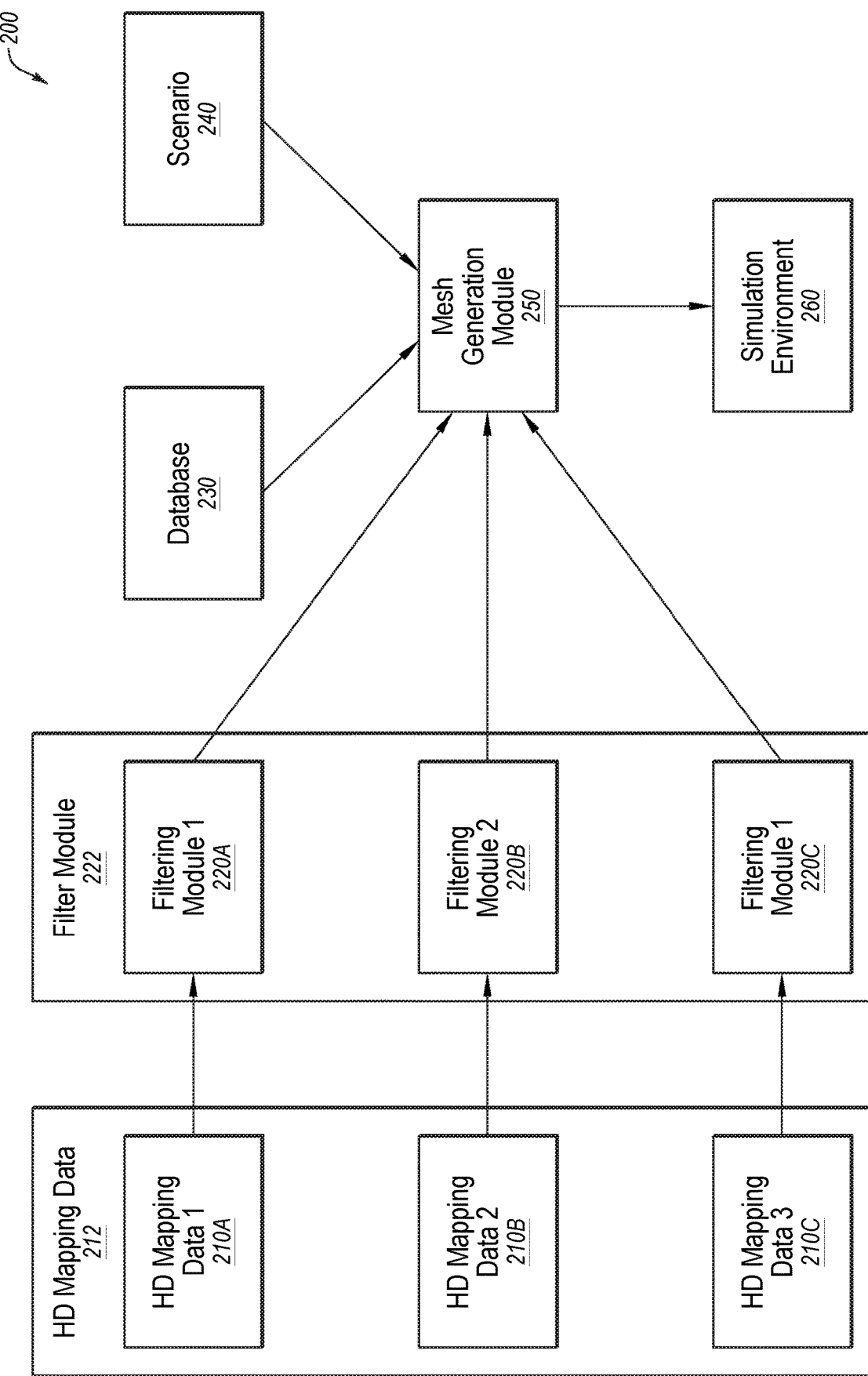
FIG. 2 is a diagram representing another example environment related to generating a simulation environment.

FIG. 2 is a diagram representing another example environment 200 related to generating a simulated driving environment, arranged in accordance with at least one embodiment described in the present disclosure. The environment 200 may include a filtering module 222 that includes a first filtering module 220A, a second filtering module 220B, and a third filtering module 220C and a mesh generation module 250.

The filtering module 222 may be configured to perform one or more filtering operations analogous to those described above with respect to the filtering module 110 of FIG. 1. Additionally or alternatively, the filtering module 222 may be configured to perform filtering operations with respect to HD mapping data 212, which may include first HD mapping data 210A, second HD mapping data 210B, and third HD mapping data 210C. For instance, each of the filtering modules 220 may be configured to receive corresponding HD mapping data. For example, the first filtering module 220A may be configured to receive the first HD mapping data 210A, the second filtering module 220B may be configured to receive the second HD mapping data 210B, and the third filtering module 220C may be configured to receive the third HD mapping data 210C.

In some embodiments, the HD mapping data 212 may include data describing a geographic area. The HD mapping data 212 may describe a geographic area in the real world. The HD mapping data 212 may include data in multiple different data topics. For example, the HD mapping data 212 may include road data, general area data, and terrain data such as that described above with respect to FIG. 1.

In some embodiments, the HD mapping data 212 may include a point cloud generated from data from LIDAR sensors. In these and other embodiments, the point cloud may include thousands of points, millions of points, billions of points, or more points. In some embodiments, as discussed above, each data point in the point cloud may include positional information (e.g., x-, y-, and z-coordinates on three-dimensional axes) as well as intensity information (e.g., reflective information). As also discussed above, the points in the point cloud may correspond to elements in the geographic setting associated with the HD mapping data 212. In some embodiments, the intensity information may facilitate the differentiation of the points in the point cloud into different data topics.

In some embodiments, data topics may be nested. For example, lane lines may be a data topic. Dashed lane lines, solid lane lines, and double solid lane lines may be subtopics of the lane lines data topic. Alternatively or additionally, yellow lane lines and white lane lines may be subtopics of the lane lines data topic and/or the dashed lane lines, solid lane lines, and double solid lane lines subtopics.

As mentioned above, in some embodiments, points in the point cloud may be organized into data topics based on the intensity information, the positional information, and/or other information. In some embodiments, the point cloud may include or may be supplemented by Global Positioning System (GPS) data. For example, a center of the point cloud may be associated with particular GPS coordinates and the positional information (i.e., the x-, y-, and z-coordinates) may be referenced from the center with the particular GPS coordinates.

In some embodiments, the HD mapping data 212 may include highly accurate and/or detailed information regarding particular geographic and/or traffic elements but may not include highly accurate and/or detailed information regarding other elements. For example, the HD mapping data 212 may include highly accurate data, for example, concerning the location of an intersection on a road and the location of lane lines on a road but may not distinguish between individual trees in a copse of trees.

As indicated above, in some embodiments, the HD mapping data 212 may include road data, general area data, and/or terrain data.

The filtering module 222 (including the filtering modules 220) may include code and routines configured to enable a computing device to perform one or more operations with respect to filtering HD mapping data 212 to obtain filtered HD mapping data. Additionally or alternatively, the filtering module 222 may be implemented using hardware including a processor, a microprocessor (e.g., to perform or control performance of one or more operations), a field-programmable gate array (FPGA), or an application-specific integrated circuit (ASIC). In some other instances, the filtering module 222 may be implemented using a combination of hardware and software. In the present disclosure, operations described as being performed by the filtering module 222 may include operations that the filtering module 222 may direct a corresponding system to perform.

As indicated above, in some embodiments, the filtering module 222 may be configured to filter the HD mapping data 212 according to one or more filtering operations such as described above with respect to the filtering module 110 of FIG. 1. In these or other embodiments, each of the filtering modules 220 may be associated with a particular data topic. For example, in some embodiments, the first filtering module 220A may be associated with lane lines. In these and other embodiments, the first filtering module 220A may be configured to receive HD mapping data 212 for a lane lines data topic, e.g., the first HD mapping data 210A, and to filter some of the HD mapping data 212 to generate filtered HD mapping data for lane lines.

Similarly, the second filtering module 220B may be associated with curbs. In these and other embodiments, the second filtering module 220B may be configured to receive HD mapping data 212 for a curbs data topic, e.g., the second HD mapping data 210B, and to filter some of the HD mapping data 212 to generate filtered HD mapping data for curbs.

Similarly, the third filtering module 220C may be associated with road edges. In these and other embodiments, the third filtering module 220C may be configured to receive HD mapping data 212 for a road edge data topic, e.g., the third HD mapping data 210C, and to filter some of the HD mapping data 212 to generate filtered HD mapping data for road edges.

Lane lines, curbs, and road edges are merely examples of data topics that may be described in HD mapping data 212 and other topics are considered. For example, in some embodiments, the HD mapping data 212 may include any number of different types of HD mapping data 210 that corresponds to any number of different data topics. Additionally or alternatively, the filtering module 222 may include more filtering modules 220 such as, for example, ten filtering modules 220, twenty filtering modules 220, one hundred filtering modules 220, etc. Alternatively, in some embodiments, the filtering module 222 may include fewer filtering modules 220. Further although described as each corresponding to different data topics, in some embodiments, one or more of the filtering modules 220 may each correspond to any number of data topics. Further, in some embodiments, the environment 200 may not include the filtering module 222 or any of its sub-filtering modules 220.

In some embodiments, the autonomous-vehicle software may be configured to determine and/or control the position of the vehicle (e.g., the tires of the vehicle) with a high degree of accuracy relative to elements of the road data. For example, the autonomous-vehicle software may spend more processing time determining where the vehicle is relative to the lane lines than the processing time spent determining where the vehicle is relative to a building beside the road. As such, the autonomous-vehicle software may determine where the autonomous vehicle is relative to the lane lines with a higher degree of accuracy than the degree of accuracy used in determining the where the autonomous vehicle is relative to the building.

In some embodiments, the filtering module 222 may filter the HD mapping data 212 depending on the environment (e.g., rural, highway, urban, etc.) from which the HD mapping data 212 is obtained such as described above. In these and other embodiments, the first filtering module 220A, the second filtering module 220B, and the third filtering module 220C may employ similar filtering for the first HD mapping data 210A, the second HD mapping data 210B, and the third HD mapping data 210C, respectively, based on the environment to which the HD mapping data 210 corresponds.

As discussed above, in some embodiments, different data topics may include different amounts of filtering. For example, in these and other embodiments, the first filtering module 220A may filter the first HD mapping data 210A to a greater degree than the second filtering module 220B may filter the second HD mapping data 210B. For example, as discussed above, in some embodiments, points in a "road edge" data topic may be filtered to a greater degree than points in a "lane line" data topic. Alternatively or additionally, in some embodiments, points in a "dashed line" data topic may be filtered to a greater degree than points in a "solid line" data topic.

In some embodiments, filtering the HD mapping data 212 may depend on both the environment and on the data topic. For example, in a highway environment, a road edge data topic may be of relatively greater importance than other data topics. Thus, when the environment is a highway, a filtering module 220 associated with road edges may filter the data less than other filtering modules 220. Alternatively, when the environment is an urban area, a curbs data topic may be of relatively greater interest than other data topics. Thus, when the environment is an urban area, a filtering module 220 associated with curbs may filter the data less than other filtering modules 220.

The filtering modules 220 may provide filtered HD mapping data of each the HD mapping data 210 to the mesh generation module 250. In some embodiments, the HD mapping data 212 may be separated into distinct files. In these and other embodiments, the filtered HD mapping data from the filtering module 222 may similarly be separated into distinct files for each data topic. In these and other embodiments, separating input files based on data topics may facilitate the creation of a mesh by the mesh generation module 250. For example, separation of distinct data topics into different files may make the mesh generation module 250 more efficient.

In some embodiments, the mesh generation module 250 may be included in or an example of the environmental creation module 120 of FIG. 1. The mesh generation module 250 may include code and routines configured to enable a computing device to perform one or more operations with respect to generating one or more meshes from the HD mapping data 212 and/or from filtered HD mapping data from the filtering module 222. Additionally or alternatively, the mesh generation module 250 may be implemented using hardware including a processor, a microprocessor (e.g., to perform or control performance of one or more operations), a field-programmable gate array (FPGA), or an application-specific integrated circuit (ASIC). In some other instances, the mesh generation module 250 may be implemented using a combination of hardware and software. In the present disclosure, operations described as being performed by the mesh generation module 250 may include operations that the mesh generation module 250 may direct a corresponding system to perform.

Although depicted as a single mesh generation module 250, in some embodiments, there may be more than one mesh generation module 250. For example, in these and other embodiments, there may be a mesh generation module 250 for each data topic in the HD mapping data 212. That is, in some embodiments, there may be an equal number of HD mapping data 210, filtering modules 220, and mesh generation modules 250.

In some embodiments, the mesh generation module 250 may generate a mesh for each distinct instance of each data topic of the point cloud of the HD mapping data 212. In these and other embodiments, a mesh may include a 3-D representation of the points in the point cloud with polygons connecting the data points. For example, in some embodiments, the points in the point cloud may be distinct points and may not be connected to any other points. In these and other embodiments, a mesh may include the points of the point cloud as vertices of one or more polygons representing sides of objects in a 3-D space. For example, an object, such as a lane line, may be represented by thousands of discrete points in a point cloud. A mesh generated from the points of the point cloud representing the lane line might include lines connecting the points into the shape of the lane line. In these and other embodiments, the points may be connected by polygons, which may give the lane lines surfaces and/or a 3-D shape including thickness.

In some embodiments, after generation of a mesh, a texture may be applied to the mesh. In these and other embodiments, the texture may include colors, patterns, surface details, and/or other information to transform the mesh into a more realistic 3-D representation of an object. In these and other embodiments, different data topics may correspond with different textures. For example, in some embodiments, yellow lane lines and white lane lines may represent different data topics and may be associated with different textures. In these and other embodiments, the different textures may correspond with different real-world examples of the data topics. For example, for yellow lane lines, different textures may include "clean lines," in which the yellow lane lines are clean and distinct; "faded lines," in which the yellow lane lines appear faded; and "cracked lines," in which part of the yellow lane lines may have lost their color.

Application of multiple textures to a mesh is also contemplated. In some embodiments, multiple textures may be applied to a single mesh. For example, in some embodiments, textures may be applied to specific polygons (such as, for example, specific triangles) within a single mesh but may not be applied to other polygons in the mesh. For example, a first texture may be applied to some polygons in a particular mesh and a second texture may be applied to other polygons in the particular mesh. Alternatively or additionally, in some embodiments, multiple textures may be layered on particular mesh polygons. For example, a first texture may be applied to all polygons in a particular mesh and a second texture may be layered on top of the first texture for some of the polygons in the particular mesh. Alternatively or additionally, in some embodiments, textures may not be applied to some polygons in a particular mesh while one or more textures may be applied to other polygons in the particular mesh.

In some embodiments, providing different textures for different instances of a single data topic may result in a more robust simulation environment. For example, when an autonomous vehicle is driving along a road, not all instances of a particular data topic will appear the same. As discussed above, lane lines may be in different states of disrepair, with some lane lines faded, some well maintained, and others missing at points. By providing a method to easily alter the appearance of some instances of a data topic while maintaining the appearance of other instances of the same data topic, the simulation environment may provide a better test of whether an autonomous vehicle will correctly recognize lane lines or other objects even when the objects differ in appearance from the standard version of the object or when the objects may differ over the course of a relatively short distance (e.g., where lane lines are currently being painted and a first segment of the lane lines are freshly painted and a second segment of the lane lines are faded and/or cracked.

In addition to applying different textures to different instances of a particular data topic, the mesh generation module 250 may apply different textures to instances of different data topics. In these and other embodiments, the textures that may be applied to one data topic may differ from the textures that may be applied to another data topic. For example, textures associated with road edge data topics may be different from those associated with curb data topics.

In addition to generating a mesh from HD mapping data 212, the mesh generation module 250 may be configured to generate meshes from a database 230 and/or from scenarios 240. In these and other embodiments, the database 230 may include information about buildings and/or other objects that may not be included in HD mapping data 212 from LIDAR sensors and/or about which the HD mapping data 212 may include incomplete information. For example, traditional LIDAR sensors on automobiles may be directed horizontally or below horizontal. Thus, traditional LIDAR data in the form of a point cloud may include incomplete information about objects, such as buildings, over the height of an automobile.

The scenario data 240 may include information about trees, shrubbery, and/or other objects that may similarly be incompletely and/or inaccurately captured in LIDAR data. Alternatively or additionally, in some embodiments, the scenario data 240 may be associated with a particular scenario in which it is desired to test an autonomous vehicle.

The database 230 and the scenario data 240 may thus supplement the information from the HD mapping data 212 to help the mesh generation module 250 generate a more realistic and/or robust building for a simulation environment. In some embodiments, the database 230 and/or the scenario data 240 may not be data in the form of a point cloud, unlike the HD mapping data 212. In these and other embodiments, the mesh generation module 250 may not generate a mesh from the database 230 or the scenario data 240. In these and other embodiments, the database 230 and/or the scenario data 240 may include data in the form of a layer which may be positioned on top of one or more meshes generated by the mesh generation module 250. For example, in some embodiments, each mesh generated by the mesh generation module 250 may be a layer in a simulation environment 260. The database 230 may also include several layers for the simulation environment 260. For example, in some embodiments, each building in the database 230 and/or each static object such as, for example, a tree, may be a separate layer in the simulation environment 260.

In some embodiments, the mesh generation module 250 may further add one or more decals to the textures of the meshes. For example, in some embodiments, the decals may include details associated with a data topic and/or a texture applied to a particular instance of a data topic. For example, in some embodiments, details indicating a crack in a road may be added to a texture for a road surface as a decal. Alternatively or additionally, in some embodiments, decals indicating a pothole in a road may be added. Alternatively or additionally, in some embodiments, a decal may depict other road qualities that may be tailored to a specific simulation environment in order to test the robustness of an autonomous vehicle against particular targeted deficiencies.

The simulation environment 260 may include a combination of the meshes generated for the different data topics to represent the corresponding environment and its elements such as a variety of lane lines, curbs, road edges, buildings, trees, and/or other information associated with autonomous vehicles and traffic. In some embodiments, the simulation environment 260 may include multiple layers, including a base layer and different layers for each mesh generated by the mesh generation module 250 and layers for the database 230 and the scenario data 240. The simulation environment 260 may include a 3-D model of one or more objects in the geographic area as described by the HD mapping data 212. In some embodiments, the simulation environment 260 may be an example of the environmental representation 122 of FIG. 1

Modifications, additions, or omissions may be made to the environment 200 of FIG. 2 without departing from the scope of the present disclosure. For example, the environment 200 may include more or fewer elements than those illustrated and described in the present disclosure. For instance, the database 230 and/or the scenario data 240 may be omitted. In these embodiments, information related to buildings and/or static objects may be included in the HD mapping data 212 or may be omitted.

Figure 3:
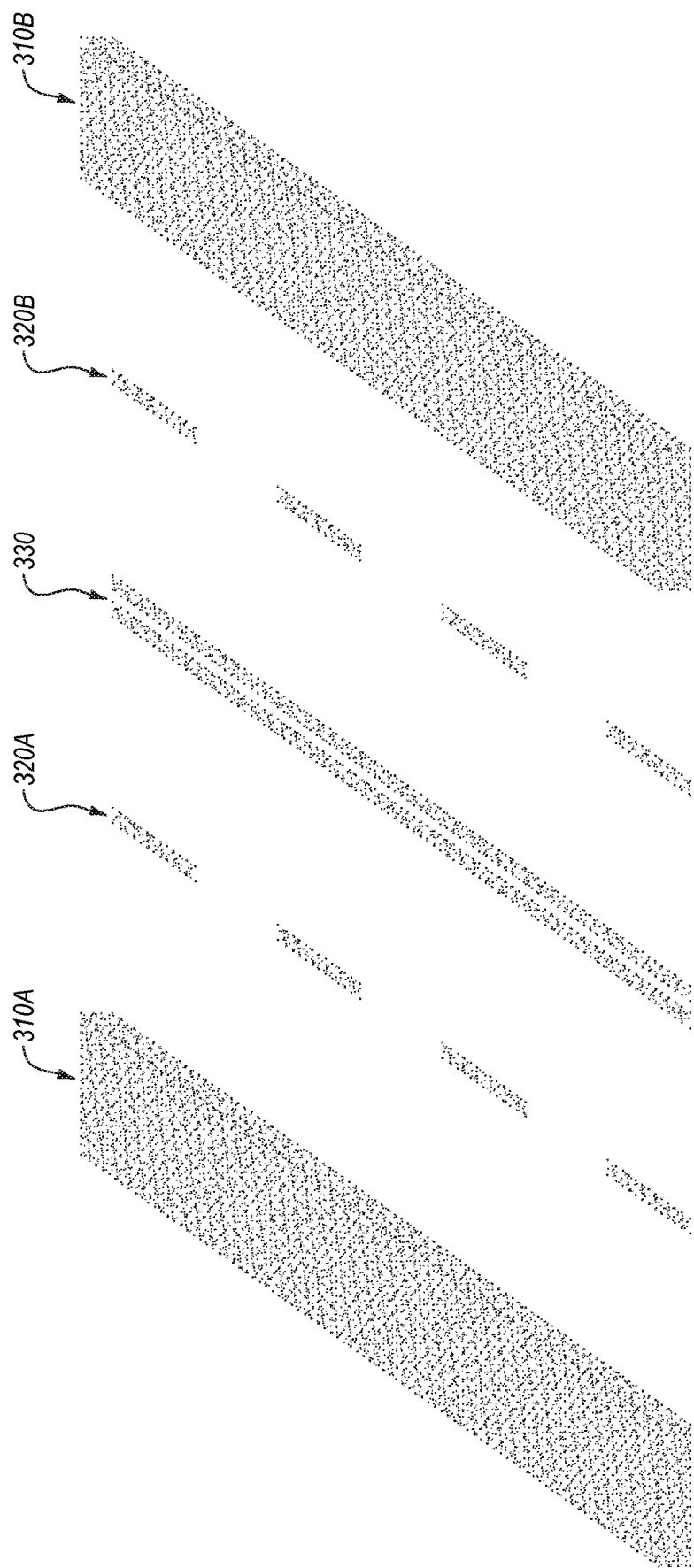
FIG. 3 illustrates an example point cloud.

FIG. 3 illustrates an example point cloud of HD mapping data, according to at least one embodiment of the present disclosure. As depicted in FIG. 3, the HD mapping data may include a first sidewalk 310A and a second sidewalk 310B (collectively the sidewalks 310), a first dashed white line 320A and a second dashed white line 320B (collectively the dashed white lines 320), and solid yellow double center line 330. In these and other embodiments, the sidewalks 310, the dashed white lines 320, and the solid yellow double center line 330 may each represent a distinct data topic. In these and other embodiments, the first sidewalk 310A and the second sidewalk 310B may each represent a distinct instance of the sidewalks 310 data topic. Similarly, the first dashed white line 320A and the second dashed white line 320B may each represent a distinct instance of the dashed white lines 320 data topic. The solid yellow double center line 330 may also represent a distinct instance of the solid yellow double center line 330 data topic.

In some embodiments, each object in the point cloud may include multiple points. For example, in some embodiments, each of the first sidewalk 310A, the second sidewalk 310B, the first dashed white line 320A, the second dashed white line 320B, and the solid yellow double center line 330 may include thousands of points, millions of points, or any number of points.

In some embodiments, the point cloud may also include additional points than those illustrated in FIG. 3. For example, in some embodiments, points may also be located between the first sidewalk 310A and the first dashed white line 320A (i.e., points associated with the road), or between the first dashed white line 320A and the solid yellow double center line 330 (i.e., points associated with the road). In these and other embodiments, each of the points associated with an object may include positional information (represented in FIG. 3 as the location of the point) and intensity information (represented in FIG. 3 as the distinction between objects). For example, points in the point cloud may be determined to be associated with the first sidewalk 310A and not a road based on the intensity associated with the point. Additionally or alternatively, in some embodiments, points may be determined to be associated with a particular data topic or a particular instance of a data topic based on the proximity of the points to other points of a similar data topic. For example, the points of the first dashed white line 320A and the second dashed white line 320B may both be determined to be associated with the dashed white line 320 data topic based on the intensity of the points but may be determined to be distinct instances of the dashed white line 320 data topic based on the distance between the points and an approximate direction of the group of points.

Figure 4:
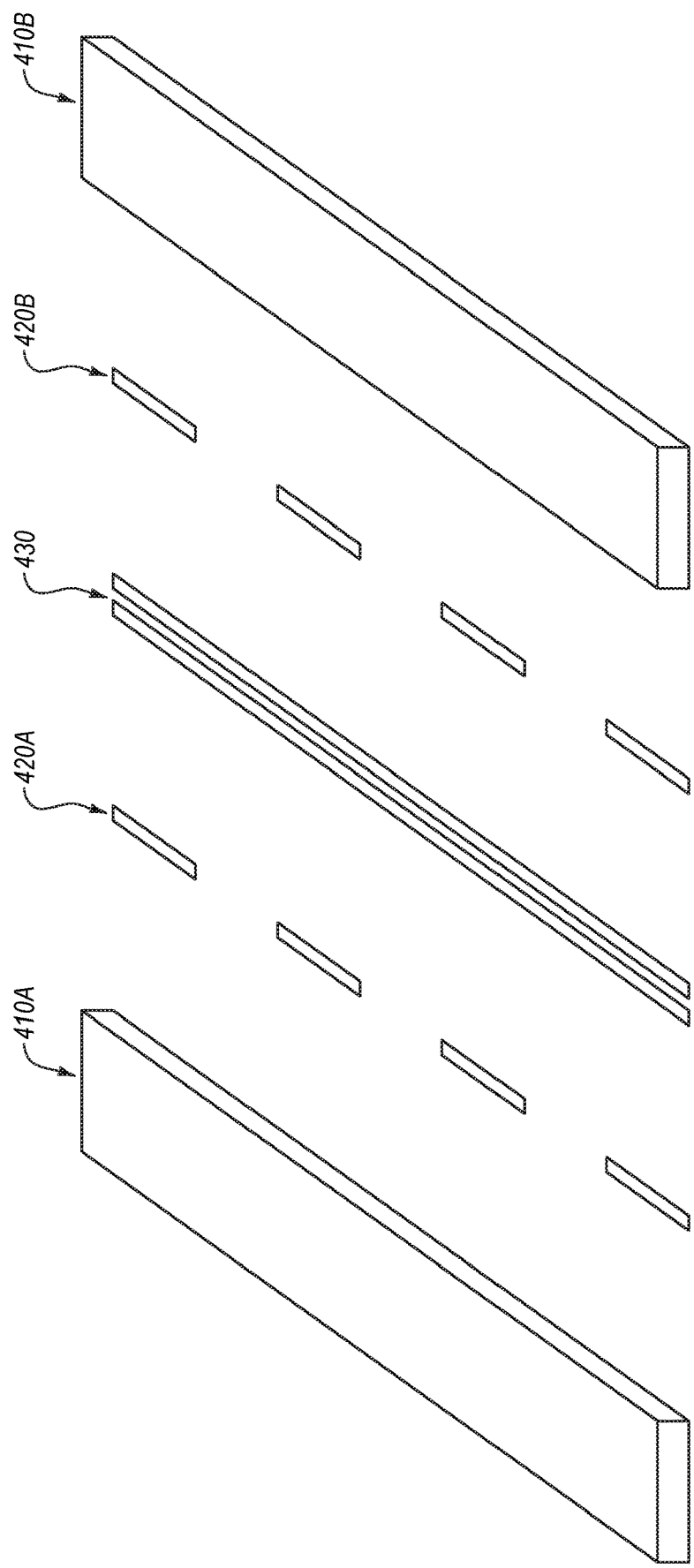
FIG. 4 illustrates example meshes.

FIG. 4 illustrates example meshes, according to at least one embodiment of the present disclosure. In some embodiments, the meshes of FIG. 4 may be generated from a point cloud such as the point cloud depicted in FIG. 4. As depicted in FIG. 4, the meshes may include a first sidewalk mesh 410A and a second sidewalk mesh 410B (collectively the sidewalks 410), a first dashed white line mesh 420A and a second dashed white line mesh 420B (collectively the dashed white lines 420), and solid yellow double center line mesh 430. In these and other embodiments, the sidewalks 410, the dashed white lines 420, and the solid yellow double center line 430 may each represent a distinct data topic. In these and other embodiments, the first sidewalk mesh 410A and the second sidewalk mesh 410B may each represent a distinct instance of the sidewalks 410 data topic. Similarly, the first dashed white line mesh 420A and the second dashed white line mesh 420B may each represent a distinct instance of the dashed white lines 420 data topic. The solid yellow double center line mesh 430 may also represent a distinct instance of the solid yellow double center line 430 data topic.

In some embodiments, each mesh may include multiple polygons, each polygon formed from points in the point cloud. For example, in some embodiments, as compared to the corresponding objects in FIG. 3, each object in FIG. 4 may include surfaces representing sides of an object in 3-D space. For example, the first sidewalk mesh 410A may include side and top surfaces, the second sidewalk mesh 410B may include side and top surfaces, the first dashed white line mesh 420A may include side and top surfaces, the second dashed white line mesh 420B may include side and top surfaces, and the solid yellow double center line 430 may include side and top surfaces. In these and other embodiments, each mesh may include many polygons, some of which may not be contiguous with other polygons. For example, while the first sidewalk mesh 410A is depicted with a single rectangular polygon as a top surface, it may also include many distinct polygons as a top surface. The first dashed white line mesh 420A may include multiple noncontiguous polygons. For example, as depicted, the first dashed white line mesh 420A may include three sets of noncontiguous polygons.

In some embodiments, additional meshes may be generated from a point cloud. For example, in some embodiments, meshes may also be generated between the first sidewalk mesh 410A and the first dashed white line mesh 420A, for example as a road mesh. For example, in some embodiments, a point cloud may include points between the first sidewalk mesh 410A and the first dashed white line mesh 420A corresponding to, for example, a road.

In some embodiments, the meshes of FIG. 4 may include additional elements. For example, as discussed above, the meshes of distinct instances of data topics may include textures. As an example, the first dashed white line mesh 420A may include a "faded" texture while the second dashed white line mesh 320B may include "freshly painted" texture.

Figure 5:
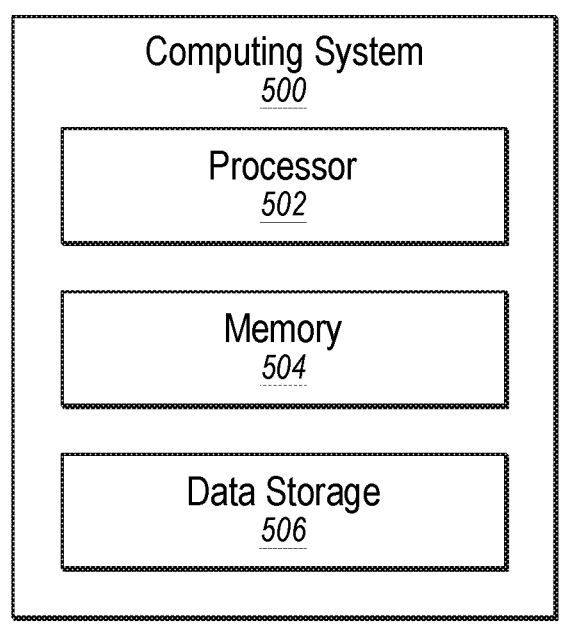
FIG. 5 illustrates a block diagram of an example computing system.

FIG. 5 illustrates a block diagram of an example computing system 500, according to at least one embodiment of the present disclosure. The computing system 500 may be configured to implement or direct one or more operations associated with any one of the modules discussed in the present disclosure. The computing system 500 may include a processor 502, a memory 504, and a data storage 506. The processor 502, the memory 504, and the data storage 506 may be communicatively coupled.

In general, the processor 502 may include any suitable special-purpose or general-purpose computer, computing entity, or processing device including various computer hardware or software modules and may be configured to execute instructions stored on any applicable computer-readable storage media. For example, the processor 502 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data. Although illustrated as a single processor in FIG. 5, the processor 502 may include any number of processors configured to, individually or collectively, perform or direct performance of any number of operations described in the present disclosure. Additionally, one or more of the processors may be present on one or more different electronic devices, such as different servers.

In some embodiments, the processor 502 may be configured to interpret and/or execute program instructions and/or process data stored in the memory 504, the data storage 506, or the memory 504 and the data storage 506. In some embodiments, the processor 502 may fetch program instructions from the data storage 506 and load the program instructions in the memory 504. After the program instructions are loaded into memory 504, the processor 502 may execute the program instructions.

For example, in some embodiments, one or more of the above mentioned modules may be included in the data storage 506 as program instructions. The processor 502 may fetch the program instructions of a corresponding module from the data storage 506 and may load the program instructions of the corresponding module in the memory 504. After the program instructions of the corresponding module are loaded into memory 504, the processor 502 may execute the program instructions such that the computing system may implement the operations associated with the corresponding module as directed by the instructions.

The memory 504 and the data storage 506 may include computer-readable storage media for carrying or having computer-executable instructions or data structures stored thereon. Such computer-readable storage media may include any available media that may be accessed by a general-purpose or special-purpose computer, such as the processor 502. By way of example, and not limitation, such computer-readable storage media may include tangible or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 502 to perform a certain operation or group of operations.

Modifications, additions, or omissions may be made to the computing system 500 without departing from the scope of the present disclosure. For example, in some embodiments, the computing system 500 may include any number of other components that may not be explicitly illustrated or described.

Figure 6:
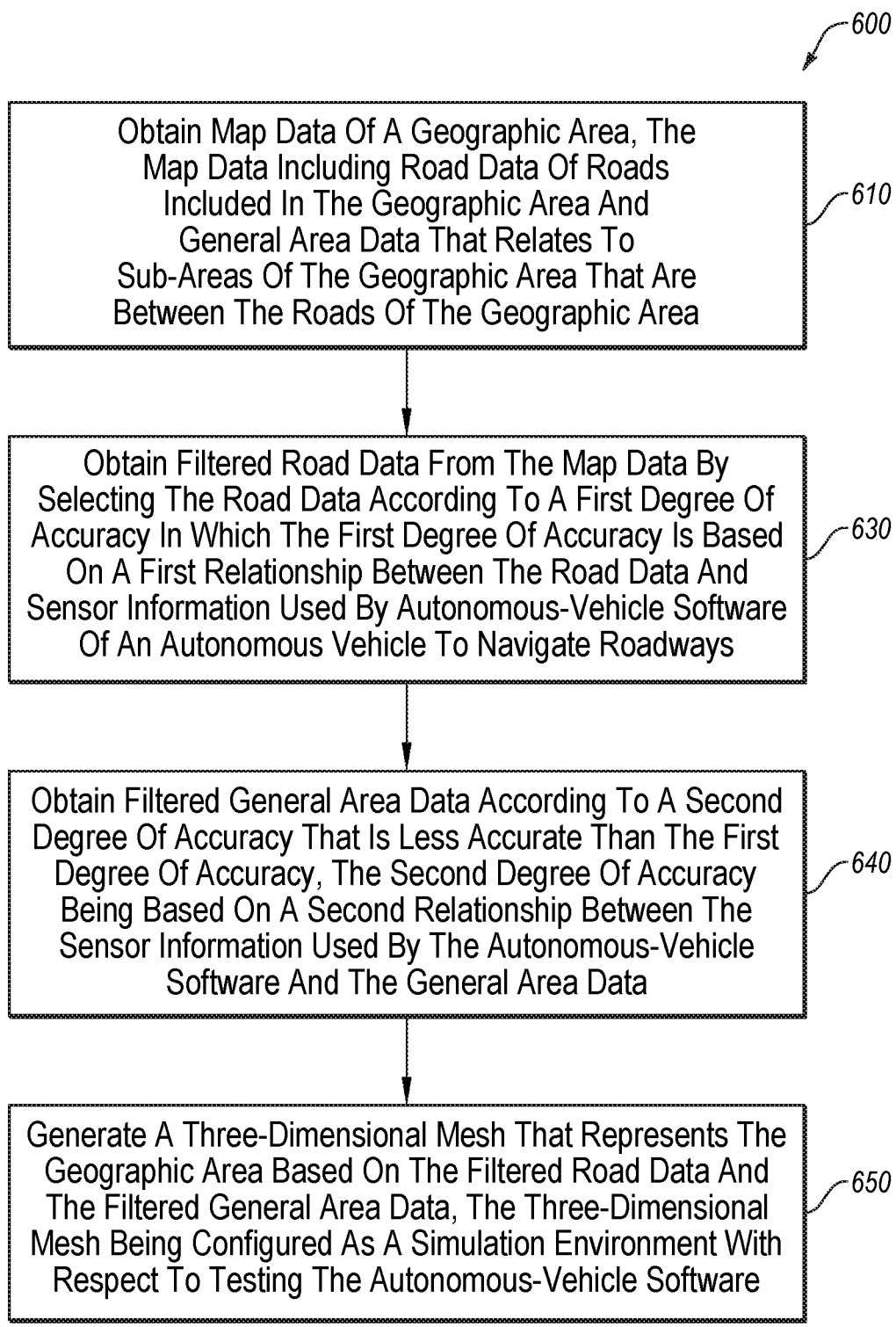
FIG. 6 is a flowchart of an example method of generating a simulation environment.

FIG. 6 is a flowchart of an example method 600 of generating a simulated driving environment, according to at least one embodiment described in the present disclosure. The method 600 may be performed by any suitable system, apparatus, or device with respect to the simulated driving environment. For example, one or more of the filtering module 110 of FIG. 1, the filtering module 222 of FIG. 2, the environmental representation-creation module 120 of FIG. 1, the mesh generation module 250 of FIG. 2, or the computing system 500 of FIG. 5 (e.g., as directed by one or more modules) may perform one or more of the operations associated with the method 600. Although illustrated with discrete blocks, the steps and operations associated with one or more of the blocks of the method 600 may be divided into additional blocks, combined into fewer blocks, or eliminated, depending on the particular implementation.

The method 600 may begin at block 610, where map data of a geographic area may be obtained. The map data may include road data of roads included in the geographic area and general area data that relates to sub-areas of the geographic area that are between the roads of the geographic area. The map data 102 of FIG. 1 may be an example of the obtained map data, including the road data and the general area data. The general area data 105 of FIG. 1 may be an example of the obtained road data. The analysis module 107 of FIG. 1 may be an example of the obtained general area data.

In some embodiments, autonomous-vehicle data that relates to sensor information used by autonomous-vehicle software of an autonomous vehicle to navigate roadways may be obtained. In some embodiments, the autonomous-vehicle data may include sensor information that is received by the autonomous-vehicle software. Additionally or alternatively, the autonomous-vehicle data may include sensor information that is received by the autonomous-vehicle software and then used by the autonomous-vehicle software (e.g., to navigate roadways).

In these or other embodiments, one or more relationships between the road data and the sensor information used by the autonomous-vehicle software to navigate roadways may be obtained. Additionally or alternatively, one or more relationships between the sensor information used by the autonomous-vehicle software and the general area data may be obtained. The relationships may relate the autonomous-vehicle data to the map data. For example, the relationships may describe how information derived from the map data (e.g., simulated sensor readings based on 3-D environmental representations representing objects in the map data) may be used by autonomous-vehicle software to navigate roadways.

In these or other embodiments, one or filters, which may include rules for filtering map data, may be obtained. The filters may be based on the one or more relationships, and/or the autonomous-vehicle data.

At block 630, filtered road data may be obtained from the map data by selecting (which may include filtering) the high definition road data according to a first degree of accuracy. The first degree of accuracy may be based on a first relationship between the road data and sensor information used by autonomous-vehicle software of an autonomous vehicle to navigate roadways. The filtered road data 113 of FIG. 1 may, for example, include the obtained filtered road data. In some embodiments, the filtering module 110 of FIG. 1 may select the map data.

At block 640, filtered general area data according to a second degree of accuracy may be obtained. The filtered general area data may be obtained by selecting (which may include filtering) the general area data according to the second degree of accuracy. The second degree of accuracy may be less accurate than the first degree of accuracy. The second degree of accuracy may be based on a second relationship between the sensor information used by the autonomous-vehicle software and the general area data. The filtered general area data 115 of FIG. 1 may, for example, include the obtained filtered general area data. In some embodiments, the filtering module 110 of FIG. 1 may select the general area data.

At block 650, a three-dimensional environmental representation that represents the geographic area may be generated based on the filtered road data and the filtered general area data. The three-dimensional environmental representation may be configured as a simulation environment with respect to testing the autonomous-vehicle software. The 3-D environmental representation 122 of FIG. 1 may be an example of the generated three-dimensional environmental representation. The environmental representation-creation module 120 of FIG. 1 may generate the three-dimensional environmental representation.

In some embodiments, the map data may, additionally or alternatively, include terrain data that indicates elevation information of the geographical area. In these or other embodiments, the method 600 may include obtaining filtered terrain data by selecting (which may include filtering) the terrain data according to a third degree of accuracy. The third degree of accuracy may be based on the filtering of the road data according to the first degree of accuracy. For example, the third degree of accuracy may be the same as, or no greater than, the first degree of accuracy. As another example, the third degree of accuracy may be based on an error margin with respect to the filtering of the road data according to the first degree of accuracy. In these or other embodiments, the method 600 may include generating the three-dimensional environmental representation based on the filtered terrain data.

The method 600 may improve the efficiency and efficacy of generating 3-D environmental representations and/or 3-D models including 3-D environments for autonomous-vehicle software testing. For example, the method 600 may remove extraneous map data such that 3-D environmental representations generated based on the filtered map data may not include extraneous data.

Modifications, additions, or omissions may be made to the method 600 without departing from the scope of the present disclosure. For example, the operations of method 600 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

Figure 7:
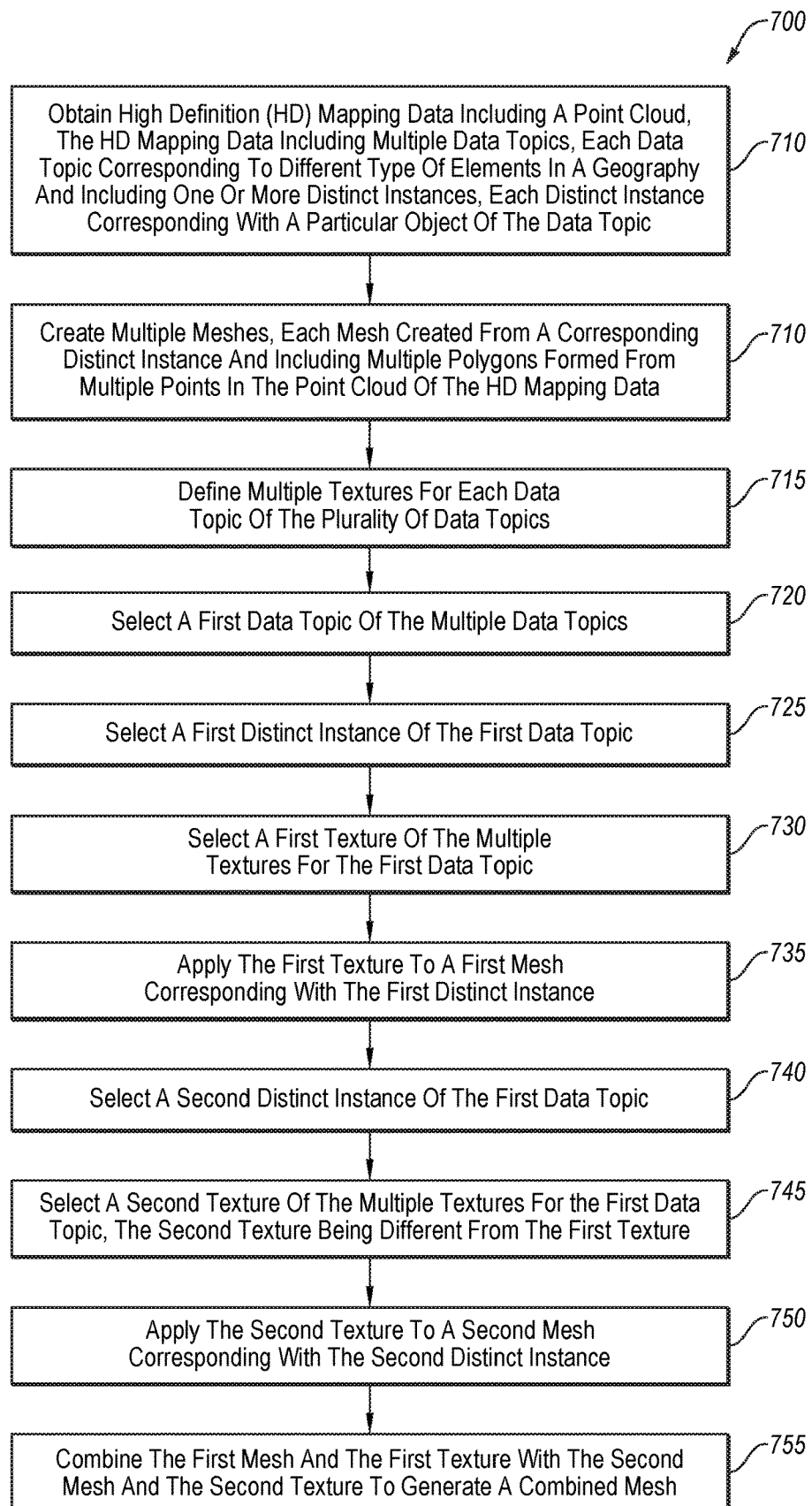
FIG. 7 is a flowchart of another example method of generating a simulation environment, all arranged according to at least one embodiment described in the present disclosure.

FIG. 7 is a flowchart of an example method 700 of generating a simulation environment, according to at least one embodiment described in the present disclosure. The method 700 may be performed by any suitable system, apparatus, or device with respect to the simulation environment. For example, one or more of the filtering module 110 of FIG. 1, the filtering module 222 of FIG. 2, the environmental representation-creation module 120 of FIG. 1, the mesh generation module 250 of FIG. 2, or the computing system 500 of FIG. 5 (e.g., as directed by one or more modules) may perform one or more of the operations associated with the method 700. Although illustrated with discrete blocks, the steps and operations associated with one or more of the blocks of the method 700 may be divided into additional blocks, combined into fewer blocks, or eliminated, depending on the particular implementation.

The method 700 may begin at block 705, where high definition (HD) mapping data may be obtained. The HD mapping data may include a point cloud. The HD mapping data may include multiple data topics. Each data topic may correspond to different types of elements in a geography. Each data topic may include one or more distinct instances and each distinct instance may correspond with a particular object of the data type.

At block 710, multiple meshes may be created. Each mesh may be created from a corresponding distinct instance and may include multiple polygons formed from multiple points in the point cloud of the HD mapping data. At block 715, multiple textures may be defined for each data topic of the multiple data topics.

At block 720, a first data topic of the multiple data topics may be selected. In some embodiments, the first data topic may be a lane line data topic. At block 725, a first distinct instance of the first data topic may be selected.

At block 730, a first texture of the multiple textures for the first data topic may be selected. In some embodiments, when the first data topic is a lane line data topic, the multiple textures may include clean lines, cracked lines, and faded lines. At block 735, the first texture may be applied to a first mesh corresponding with the first distinct instance.

At block 740, a second distinct instance of the first data topic may be selected. At block 745, a second texture of the multiple textures for the first data topic may be selected. The second texture may be different from the first texture.

At block 750, the second texture may be applied to a second mesh corresponding with the second distinct instance. At block 755, the first mesh and the first texture may be combined with the second mesh and the second texture to generate a combined mesh. In some embodiments, the combined mesh may be included in or used with a 3-D environmental representation such as described above.

The method 700 may improve the efficiency and efficacy of generating 3-D environmental representations and/or 3-D models including 3-D environments for autonomous-vehicle software testing. For example, the method 700 may allow more efficient creation of testing environments and may allow more robust testing by providing multiple distinct textures for particular elements in an environment.

Modifications, additions, or omissions may be made to the method 700 without departing from the scope of the present disclosure. For example, the operations of method 700 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments. For example, in some embodiments, the method 700 may also include rendering a simulation environment using the combined mesh. The simulation environment may include one or more autonomous vehicles. Alternatively or additionally, in some embodiments, the method 700 may include adding a decal as an additional element to the first texture.

Alternatively or additionally, in some embodiments, the method 700 may include obtaining database data, the database data including a representation of one or more buildings as a building layer. The method may also include obtaining scenario data, the scenario data including a representation of one or more trees as a static object layer. The method may also include combining the building layer, the static object layer, and the combined mesh to generate a 3-D scenario environment.

Alternatively or additionally, in some embodiments, the method 700 may include selecting a second data topic of the plurality of data topics. The method may also include selecting a third distinct instance of the second data topic. The method may further include selecting a third texture of the plurality of textures for the second data topic. The method may also include applying the third texture to a third mesh corresponding with the third distinct instance. In these and other embodiments, the first mesh and the first texture may be combined with the second mesh and the second texture and the third mesh and the third texture to generate the combined mesh.

Alternatively or additionally, in some embodiments, the method 700 may further include dividing the HD mapping data into separate groups by data topic. The method may also include separately processing each group to filter the HD mapping data. The method may further include separately storing each processed group.

As indicated above, the embodiments described in the present disclosure may include the use of a special purpose or general purpose computer (e.g., the processor 502 of FIG. 5) including various computer hardware or software modules, as discussed in greater detail below. Further, as indicated above, embodiments described in the present disclosure may be implemented using computer-readable media (e.g., the memory 504 or data storage 506 of FIG. 5) for carrying or having computer-executable instructions or data structures stored thereon.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In this description, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A method comprising:
    obtaining high definition (HD) mapping data including a point cloud, the HD mapping data including a plurality of data topics, each data topic of the plurality of data topics corresponding to different types of elements in an area, each data topic of the plurality of data topics including one or more distinct instances, each distinct instance corresponding with a particular object of the data topic, wherein at least one data topic of the plurality of data topics is associated with a first degree of accuracy;
    selecting a particular distinct instance of a first data topic;
    applying a filter to the particular distinct instance based on a distance, wherein application of the filter to the particular distinct instance associates the particular distinct instance with a second degree of accuracy based on the distance, the second degree of accuracy being a different amount of accuracy than the first degree of accuracy;
    creating a plurality of meshes, each mesh of the plurality of meshes created from a corresponding distinct instance, the plurality of meshes including a particular mesh created from the particular distinct instance, each mesh of the plurality of meshes including a plurality of polygons formed from a plurality of points in the point cloud of the HD mapping data, the plurality of meshes including a first mesh having the first degree of accuracy and the particular mesh mesh having the second degree of accuracy;
    combining the plurality of meshes, including the first mesh having the first degree of accuracy and the second mesh having the second degree of accuracy, to generate a combined mesh; and
    rendering a simulation environment using the combined mesh.

2. The method of claim 1,
    the simulation environment including one or more autonomous vehicles.

3. The method of claim 1, wherein the first data topic is a lane line data topic, the method further comprising applying a first texture to a first mesh corresponding with the first distinct instance, the first texture being selected from a plurality of textures comprising: clean lines, cracked lines, and faded lines, the first mesh being generated with the first degree of accuracy.

4. The method of claim 1, further comprising:
    obtaining database data, the database data including a representation of one or more buildings as a building layer;
    obtaining scenario data, the scenario data including a representation of one or more trees as a static object layer; and
    combining the building layer, the static object layer, and the combined mesh to generate a 3-D scenario environment.

5. The method of claim 1, further comprising:
    selecting a second data topic of the plurality of data topics;
    selecting a second distinct instance of the second data topic;
    selecting a first texture of the plurality of textures for the second data topic; and
    applying the first texture to a first mesh corresponding with the second distinct instance, wherein combining the plurality of meshes to generate the combined mesh further comprises combining the first mesh and the first texture with the second mesh and a second texture.

6. The method of claim 1, further comprising:
    dividing the HD mapping data into separate groups by data topic;
    separately processing each group to filter the HD mapping data; and
    separately storing each processed group.

7. At least one non-transitory computer readable medium configured to store one or more instructions that when executed by at least one system perform the method of claim 1.

8. A method comprising:
    obtaining high definition (HD) mapping data including a point cloud, the HD mapping data including a plurality of data topics, each data topic of the plurality of data topics corresponding to different types of elements in an area, wherein at least one data topic of the plurality of data topics is associated with a first degree of accuracy;
    selecting a particular distinct instance of a first data topic;
    applying a filter to the particular distinct instance based on object type, wherein application of the filter to the particular distinct instance associates the particular distinct instance with a second degree of accuracy based on the object type, the second degree of accuracy being a different amount of accuracy than the first degree of accuracy;
    creating a plurality of meshes, each mesh of the plurality of meshes created from a data topic, each mesh of the plurality of meshes including a plurality of polygons formed from a plurality of points in the point cloud of the HD mapping data, the plurality of meshes including a first mesh having the first degree of accuracy and a second mesh having the second degree of accuracy;
    combining the plurality of meshes, including the first mesh having the first degree of accuracy and the second mesh having the second degree of accuracy, to generate a combined mesh; and
    rendering a simulation environment using the combined mesh.

9. The method of claim 8,
    the simulation environment including one or more autonomous vehicles.

10. The method of claim 8, further comprising:
adding a decal as an additional element to an element in the area.

11. The method of claim 8, wherein the first data topic is a lane line data topic, the method further comprising applying a first texture to a first mesh corresponding with the first distinct instance, the first texture being selected from a plurality of textures comprising: clean lines, cracked lines, and faded lines.

12. The method of claim 8, further comprising:
obtaining a representation of one or more buildings as a building layer;
obtaining a representation of one or more trees as a static object layer; and
combining the building layer, the static object layer, and the combined mesh to generate a 3-D scenario environment.

13. The method of claim 8, further comprising:
dividing the HD mapping data into separate groups by data topic;
separately processing each group to filter the HD mapping data; and
separately storing each processed group.

14. At least one non-transitory computer readable medium configured to store one or more instructions that when executed by at least one system perform the method of claim 8.

15. A method comprising:
obtaining high definition (HD) mapping data including a point cloud, the HD mapping data including a plurality of data topics, each data topic of the plurality of data topics corresponding to different types of elements in an area;
obtaining database data, the database data including a plurality of building positional information;
creating a plurality of first meshes, each mesh of the plurality of first meshes created from a data topic, each mesh of the plurality of meshes including a plurality of polygons formed from a plurality of points in the point cloud of the HD mapping data, a first data topic being associated with a first degree of accuracy, a first mesh of the plurality of meshes being created based on the first data topic and the first degree of accuracy;
creating a plurality of second meshes, each mesh of the plurality of second meshes created from a building positional information and based on a distance, a second data topic being associated with a second degree of accuracy in view of the building positional information and in view of the distance, a second mesh of the plurality of meshes being created based on the second data topic and the second degree of accuracy, the second degree of accuracy being a different amount of accuracy than the first degree of accuracy;
combining the first mesh having the first degree of accuracy with the second mesh having the second degree of accuracy to generate a combined mesh; and
rendering a simulation environment using the combined mesh.

16. The method of claim 15,
the simulation environment including one or more autonomous vehicles.

17. The method of claim 15, further comprising:
adding a decal as an additional element to the first mesh.

18. The method of claim 15, wherein the first data topic is a lane line data topic and wherein a plurality of textures for the first data topic includes: clean lines, cracked lines, and faded lines.

19. The method of claim 15, further comprising:
obtaining scenario data, the scenario data including a representation of one or more trees as a static object layer; and
combining the static object layer and the combined mesh to generate a 3-D scenario environment.

20. At least one non-transitory computer readable medium configured to store one or more instructions that when executed by at least one system perform the method of claim 15.

* * * * *